United States Patent [19]
Smith et al.

[11] Patent Number: 5,626,795
[45] Date of Patent: May 6, 1997

[54] OPTICAL QUALITY TRANSPARENT CONDUCTORS

[75] Inventors: Paul Smith; Alan J. Heeger, both of Santa Barbara; Yong Cao, Goleta, all of Calif.

[73] Assignee: Uniax Corporation, Santa Barbara, Calif.

[21] Appl. No.: 487,422

[22] Filed: Jun. 7, 1995

Related U.S. Application Data

[62] Division of Ser. No. 265,683, Jun. 23, 1994, abandoned, which is a continuation of Ser. No. 800,555, Nov. 27, 1991, abandoned.

[51] Int. Cl.$^6$ .................... H01B 1/00; H01B 1/20; H01B 1/24
[52] U.S. Cl. .................... 252/500; 528/422; 528/210; 528/215
[58] Field of Search .................... 252/500; 528/422, 528/423, 424, 210, 214, 215

[56] References Cited

U.S. PATENT DOCUMENTS

| | | | |
|---|---|---|---|
| 3,963,498 | 6/1976 | Trevoy | 96/87 A |
| 4,025,463 | 5/1977 | Trevoy | 252/500 |
| 4,526,706 | 7/1985 | Upson et al. | 252/500 |
| 4,556,623 | 12/1985 | Tamura et al. | 430/83 |
| 4,604,427 | 8/1986 | Roberts et al. | 525/185 |
| 4,759,986 | 7/1988 | Marikar et al. | 428/389 |
| 4,772,421 | 9/1988 | Ikenaga et al. | 252/500 |
| 4,781,971 | 11/1988 | Marikar et al. | 428/212 |
| 4,851,487 | 7/1989 | Yaniger et al. | 525/540 |
| 4,855,361 | 8/1989 | Yaniger et al. | 525/436 |
| 4,893,908 | 1/1990 | Wolf et al. | 350/357 |
| 4,915,985 | 4/1990 | Gould et al. | 252/500 |
| 4,935,163 | 6/1990 | Cameron | 252/500 |
| 4,935,164 | 6/1990 | Wessling et al. | 252/500 |
| 4,963,206 | 10/1990 | Shacklette et al. | 156/99 |
| 4,983,322 | 1/1991 | Elsenbaumer | 252/500 |
| 4,983,690 | 1/1991 | Cameron et al. | 525/436 |
| 5,006,278 | 4/1991 | Eisenbaumer | 252/500 |
| 5,008,041 | 4/1991 | Cameron et al. | 525/436 |
| 5,017,420 | 5/1991 | Marikar et al. | 428/212 |
| 5,069,820 | 12/1991 | Jen et al. | 252/500 |
| 5,079,096 | 1/1992 | Miyake et al. | 428/500 |
| 5,093,439 | 3/1992 | Epstein et al. | 525/540 |
| 5,133,841 | 7/1992 | Higo et al. | 204/59 R |
| 5,232,631 | 8/1993 | Cao et al. | 252/500 |
| 5,278,213 | 1/1994 | Han et al. | 524/233 |
| 5,378,404 | 1/1995 | Han et al. | 252/500 |

FOREIGN PATENT DOCUMENTS

| | | |
|---|---|---|
| 0218284 | 4/1987 | European Pat. Off. . |
| 61-195137 | 8/1986 | Japan . |
| 62-012073 | 1/1987 | Japan . |
| 62-047109 | 2/1987 | Japan . |
| 2240163 | 9/1990 | Japan . |
| 2-240163 | 9/1990 | Japan . |
| WO89/01694 | 2/1989 | WIPO . |
| WO90/10297 | 9/1990 | WIPO . |

OTHER PUBLICATIONS

English Translation of JP 2-240163 (Sep. 25, 1990).
Andreatta et al., *Mol. Cryst. Liq. Cryst.* (1990) 189:169–182 No Month Available.
Andreatta et al., *Polymer Comm.* (1990) 31(7):275–278 No Month Available.
Arjavalinghm et al., *J. Chem. Phys.* (1990) 93(1):6–9 (Abstract) Jul.

(List continued on next page.)

*Primary Examiner*—Paul Lieberman
*Assistant Examiner*—M. Kopec
*Attorney, Agent, or Firm*—Burns, Doane, Swecker & Mathis

[57] ABSTRACT

Optical quality transparent conductors such as bodies, films and coatings formed from substituted and unsubstituted polyanilines in nonconductive substrates such as polymers or polymer plus solvents with protonic acid are disclosed as are methods of forming such conductors from fluid forms of the polyaniline/substrate/acid mixtures.

6 Claims, 6 Drawing Sheets

Transmittance of pure PANI/CSA spin cast films
- 392 ohm/□ ; 0.2 μm
- 166 ohm/□ ; 0.5 μm
- 66 ohm/□ ; 1.4 μm

OTHER PUBLICATIONS

Cameron et al., *3rd International SAMPE Electronics Conference* (Jun. 20–22, 1989) pp. 1163–1174.

Chan et al., *Synth. Metals* (1989) 31(1):95–108 (Abstract) Jul.

Chan et al., *Synth. Metals*. (1990) 35(3):333–344 (Abstract) Apr.

Chiang et al., *Synth. Metals* (1986) 13:193–205 No Month Available.

Focke et al., *J. Phys. Chem.* (1987) 91:5813–5818 No Month Available.

Green et al., *J. Chem. Soc.* (1912) 101:1117–1123 No Month Available.

Kaner et al., *Scientific American* (1988) 258(2):106–111 No Month Available.

Kobayashi et al., *J. Electroanal. Chem.* (1984) 177:281–2911) No Month Available.

LaCroix et al., *Makromol. Chem. Macromol. Symp.* (1987) 8:17–37 No Month Available.

LaCroix et al., *1st International SAMPE Electronics Conference* (Jun. 23–25, 1987) pp. 649–656.

Li et al., *Synth. Metals* (1991) 40:23–28 No Month Available.

MacDiarmid et al., *Papers from the 6th European Physical Society Idustrial Workshop Eur. Phys. Soc.* Loftus, Norway, (May 28–31, 1990) (Abstract).

Malhotra et al., *J. Appl. Polymer Sci.* (1990) 40(5–6):1049–1052 No Month Available.

Monkman et al., *Synth. Metals* (1991) 40(1):87–96 (Abstract) Mar.

Salaneck et al., *Synth. Metals* (1986) 13:291–297 No Month Available.

Shacklette et al., *Symposium on Electroresponsive Molecular and Polymeric Systems*, Upton, New York, (Oct. 25–27, 1989) (Abstract).

Theophilou et al., *Electric Properties of Conjugated Polymers III Basic Models and Applications*, Proceedings of an International Winter School, (Mar. 11–18, 1989) Kirchberg, Austria, (Abstract).

OPTICAL QUALITY TRANSPARENT CONDUCTORS

This application is a divisional, of application No. 08/265,683, filed Jun. 23, 1994, now abandoned which is a file-wrapper-continuation of application No. 07/800,555 filed on Nov. 27, 1991, now abandoned.

FIELD OF THE INVENTION

This invention relates generally to optically transparent conductive polymer electrodes and films and their fabrication as fluid phase-cast coatings, free-standing and supported films and the like. The transparent conductive coatings and films are fabricated using functionalized protonic acids to induce processibility of electrically conductive substituted or unsubstituted polyaniline and blends of electrically conductive substituted or unsubstituted polyaniline with amorphous bulk polymers (polyblends), and to induce solubility of the electrically conductive substituted or unsubstituted potyaniline and the polyblends in organic liquids or fluid (melt) phases of solid polymers so as to permit the fluid-phase processing.

BACKGROUND OF THE INVENTION

There is an established need for transparent conducting materials for use as transparent electrodes, coatings and films. Such transparent materials are required in a variety of device applications, including for example the electrodes for liquid crystal displays and transparent conductive coatings for antistatic applications. Other applications include, for example, use as electrodes on polymer (or composite) objects to enable electroplating and as conductive transparent films for packaging and electrically shielding electronic goods.

Only a few materials exhibit the combination of relatively high electrical conductivity and optical transparency. The most widely used examples are mixed inorganic oxide materials, for example indium/tin oxide (ITO) and other related oxides.

Although ITO has adequate properties for many uses in technology, ITO also has many disadvantages, including the following:

(i) High vacuum technology (for example sputtering) is required for application of transparent conducting ITO or related mixed oxides onto a substrate. This vacuum technology is expensive, since it requires major capital investment for the equipment needed for application. Furthermore, application, for example by sputtering, onto curved or complex surfaces is difficult.

(ii) The precise chemical stoichiometry and morphology required for transparent conducting ITO or related mixed oxides is difficult to achieve and difficult to control. As a result, the preparation of transparent conducting ITO or related mixed oxide films is often treated as a trade secret. Thus, the routine manufacture of transparent conducting ITO or related mixed oxide films for transparent electrode applications requires precise and detailed process control.

(iii) Transparent conducting ITO or related mixed oxide films are brittle. Thus, when applied onto flexible substrates (for example onto free standing polymer films as substrates), the coated substrate is delicate and the transparent electrode is easily shattered.

(iv) Patterning of the transparent conducting ITO or related mixed oxides requires etching the insoluble ITO or related mixed oxide material. Although possible, relatively highly corrosive etching solutions are required.

Thus, there is a need for materials which are both electrically conducting and optically transparent, and which can be applied or fabricated directly from fluid phases at easy-to-obtain conditions. There is also a need for conductive devices and films which are mechanically robust and have specific and easily controlled compositions.

There exists prior art in the area of transparent conducting coatings made from conductive polymers:

(1) Shacklette et al (U.S. Pat. No. 4,963,206, Oct. 16, 1990) applied a conductive polyaniline film onto Aclar by exposing the Aclar film to a mixture of aniline tosylate and ammonium persulfate in an aqueous solution of tosic acid. Thus the conductive polyaniline film was polymerized in situ onto the substrate.

(2) Fukunishi et al (JP application no. 63145326, Jun. 17, 1988) used similar techniques to prepare polymer composites by in situ polymerization of pyrrole and aniline.

(3) Takahashi et al (JP application no. 63268733) prepared thin semitransparent films by electrolytic polymerization.

(4) Sakai et al (JP application no. 63215772, Sep. 8, 1988) manufactured conductive polymer compositions by polymerizing monomers capable of forming anionic polymer electrolytes in the presence of polymers of π-conjugated structure. Transparent thin films were deposited electrolytically.

There is no known prior art in which optical quality transparent conducting polymer films have been Acast directly from a fluid phase (melt or solution) in the conductive form (without need for subsequent doping) as the pure conductive polymer or as polyblends containing the conductive polymer.

The present invention employs polyanilines as conductive polymers. The following is a general summary of art concerning these materials.

Kobayashi Tetsuhiko et al., *J. Electroanal Chem.*, "Electrochemical Reactions Concerned With electrochromism of Polyaniline Film-Coated Electrodes," 177 (1984) 281–291, describes various experiments in which spectroelectrochemical measurement of a polyaniline film coated electrode were made. French Patent No. 1,519,729, French Patent of Addition 94,536; U.K. Patent No. 1,216,549; "Direct Current Conductivity of Polyaniline Sulfate," M. Donomedoff, F. Kautier-Cristojini, R. ReSur-vail, M. Jozefowicz, L. T. Yu, and R. Buyer, *J. Chim. Phys. Physicohim. Brol.*, 68, 1055 (1971); "Continuous Current Conductivity of Macromolecular Materials," L. T. Yu, M. Jozefowicz, and R. Buyer, *Chim. Macromol.*, 1,469 (1970); "Polyaniline Based Filmogenic Organic Conductive Polymers,"-D. LaBarre and M. Jozefowicz, *C.R. Read Sci.*, Ser. C, 269, 964 (1969); "Recently Discovered Properties of Semiconducting Polymers," M. Jozefowicz, L. T. Yu, J. Perichon, and R. Buyer, *J. Polym. Sci.*, Part C, 22, 1187 (1967); "Electrochemical Properties of Polyaniline Sulfates," F. Cristojini, R.-De Surville, and M. Jozefowicz, *Cr. Read. Sci.*, Ser. C, 268, 1346 (1979); "Electrochemical Cells Using Protolytic Organic Semiconductors," R. De Surville, M. Jozefowicz, L. T. Yu, J. Perichon, R. Buvet, *Electrochem. Ditn.* 13, 1451 (1968); "Oligomers and Polymers Produced by Oxidation of Aromatic Amines," R. De Surville, M. Jozefowicz, and R. Buvet, *Ann. Chem.* (Paris), 2, 5 (1967) "Experimental Study of the Direct Current Conductivity of Macromolecular Compound," L. T. Yu, M. Borredon, M. Jozefowicz, G. Belorgey, and R. Buyer, *J. Polym. Sci. Polym. Symp.*, 16, 2931 (1967); "Conductivity and Chemical Properties of Oligomeric Polyaniline," M. Jozefowicz, L. T. Yu, G. Belorgey, and R. Buyer, *J. Polym. Sci., Polym. Symp.*, 16, 2934 (1967); "Products of the Catalytic Oxidation of Aromatic Amines," R. De Surville, M. Jozefowicz, and R. Buyer, *Ann. Chem. (Paris)*, 2, 149 (1967); "Conductivity and Chemical Composition of Macromolecular Semiconductors," *Rev. Gen. Electr.*, 75 1014 (1966); "Relation Between the Chemical and Electrochemical Properties of Macromolecular Semiconductors," M. Jozefowicz and L. T. Yu, *Rev. Gen. Electr.*, 75, 1008 (1966); "Preparation, Chemical Properties, and Electrical Conductivity of Poly-N-Alkyl Anilines in the Solid State," D. Muller and M. Jozefowicz, *Bull. Soc. Chem. Fr.*, 4087 (1972).

U.S. Pat. Nos. 3,963,498 and 4,025,463 describe oligomeric polyanilines and substituted polyanilines having not more than 8 aniline repeat units which are described as being soluble in certain organic solvents and which are described as being useful in the formation of semiconductors compositions. European Patent No. 0017717 is an apparent improvement in the compositions of U.S. Pat. Nos. 3,963,498 and 4,025,463 and states that the polyaniline can be formed into a latex composite through use of the oligomers of polyaniline and a suitable binder polymer.

High molecular weight polyaniline has emerged as one of the more promising conducting polymers, because of its excellent chemical stability combined with respectable levels of electrical conductivity of the doped or protonated material. Processing of polyaniline high polymers into useful objects and devices, however, has been problematic. Melt processing is not possible, since the polymer decomposes at temperatures below a softening or melting point. In addition, major difficulties have been encountered in attempts to dissolve the high molecular weight polymer.

Recently, it was demonstrated that polyaniline, in either the conducting emeraldine salt form or the insulating emeraldine base form, can be processed from solution in certain strong acids to form useful articles (such as oriented fibers, tapes and the like). By solution processing from these strong acids, it is possible to form composites, or polyblends of polyaniline with other polymers (for example polyamides, aromatic polyamides (aramids), etc.) which are soluble in certain strong acids and thereby to make useful articles. "Electrically Conductive Fibers of Polyaniline Spun from Solutions in Concentrated Sulfuric Acid," A. Andreatta, Y. Cao, J. C. Chiang, A. J. Heeger and P. Smith, *Synth. Met.*, 26, 383 (1988); "X-Ray Diffraction of Polyaniline," Y. Moon, Y. Cao, P. Smith and A. J. Heeger, *Polymer Communications*, 30, 196 (1989); "Influence of the Chemical Polymerization Conditions on the Properties of Polyaniline," Y. Cao, A. Andreatta, A. J. Heeger and P. Smith, *Polymer*, 30, 2305 (1990); "Magnetic Susceptibility of Crystalline Polyaniline," C. Fite, Y. Cao and A. J. Heeger, *Sol. State Commun.*, 70, 245 (1989); "Spectroscopy and Transient Photoconductivity of Partially Crystalline Polyaniline," S. D. Phillips, G. Yu, Y. Cao, and A. J. Heeger, *Phys. Rev. B* 39, 10702 (1989); "Spectroscopic Studies of Polyaniline in Solution and in the Solid State," Y. Cao and A. J. Heeger, *Synth. Met.* 32, 263, (1989); "Magnetic Susceptibility of One-Dimensional Chains in Solution," C. Fite, Y. Cao and A. J. Heeger, *Solid State Commun.*, 73, 607 1990); "Electrically Conductive Polyblend Fibers of Polyaniline and Poly(p-phenylene terephthalamide)," A. Andreatta, A. J. Heeger and P. Smith, *Polymer Communications*, 31, 275 (1990); "Polyaniline Processed From Sulfuric Acid and in Solution in Sulfuric Acid: Electrical, Optical and Magnetic Properties," Y. Cao, P. Smith and A. J. Heeger in *Conjugated Polymeric Materials: Opportunities in Electronics, Optoelectronics, and Molecular Electronics*, ed. J. L. Bredas and R. R. Chance (Kluwer Academic Publishers, The Netherlands, 1990).

U.S. Pat. No. 4,983,322 describes solutions and plasticized compositions of electrically conductive substituted and unsubstituted polyanilines and methods of forming such solutions or compositions and use of same to form conductive articles. The polyaniline materials were made soluble by the addition of an oxidizing agent such as $FeCl_3$. Since the resulting compounds are charge transfer salts, highly polar solvents were required; specifically solvents were needed with dielectric constants equal to or greater than 25 and with dipole moments equal to or greater than 3.25.

Starting with the insulating emeraldine base form, polyaniline can be rendered conducting through two independent doping routes:

(i) Oxidation either electrochemically (by means of an electrochemical charge transfer reaction) or chemically (by means of chemical reaction with an appropriate oxidizing agent such as $FeCl_3$);

(ii) Protonation through acid-base chemistry by exposure to protonic acids (for example, in aqueous environment with pH less than 2–3). (1) 'Polyaniline': Protonic Acid Doping of the Emeraldine Form to the Metallic Regime by J.-C. Chiang and Alan G. MacDiarmid, Synthetic Metals 13 193 (1986). (2) A Two-Dimensional-Surface 'State' Diagram for Polyaniline by W. R. Salaneck, I. Lundstrom, W.-S Huang and A. G. MacDiarmid, Synthetic Metals 13, 297 (1986).

These two different routes lead to distinctly different final states. In (i), the oxidation causes a change in the total number of π-electrons on the conjugated chain and thereby renders it conductive. In (ii), there is no change in the number of electrons; the material is rendered electrically conductive by protonation of the imine nitrogen sites.

A need exists for techniques and materials to facilitate the fabrication of shaped transparent conductive polyaniline articles, especially articles made from bulk material (conductive polyanilines and/or composites, or polyblends of conductive polyaniline with other polymers) and films, fibers and coatings.

SUMMARY OF THE INVENTION

It is accordingly an object of the present invention to overcome the aforementioned disadvantages of the prior art and, primarily, to provide electrically conducting and optically transparent bodies, coatings and films for uses such as electrodes, these materials being fabricated using functionalized protonic acids to induce processibility of electrically conductive polyaniline and blends of electrically conductive polyaniline with amorphous bulk polymers. The functionalized protonic acids induce solubility of electrically conductive polyaniline and blends of electrically conductive polyaniline in amorphous bulk polymers, in organic liquids and in fluid (melt) phases of solid bulk polymers and prepolymers.

It is additionally an object of the present invention to utilize the processing advantages associated with the soluble conducting polyblends made from polyaniline with amorphous bulk polymers to make possible routine fabrication transparent electrodes on flat substrates and/or substrates with complex curved surfaces.

It is additionally an object of the present invention to provide transparent conducting bodies, coatings and films, such as electrodes formed of conducting polyblend films made from polyaniline with amorphous bulk polymers, said materials being mechanically robust and flexible.

It is additionally an object of the present invention to provide transparent conducting materials formed from polyblends of polyaniline with amorphous bulk polymers. Said polyblends are re-soluble in common organic solvents, thus enabling the use of photolithographic techniques for patterning the transparent material; said techniques being, for example, routinely used in the semiconductor industry.

Additional objects, advantages and novel features of the invention will be set forth in part in the description which follows, and in part will become apparent to those skilled in the art on examination of the following, or may be learned by practice of the invention. The objects and advantages of the invention may be realized and attained by means of the instrumentalities and combinations particularly pointed out in the appended claims. These compositions include a conductive polyaniline in intimate admixture (solution or the like) with a substrate material. The term "substrate" is used to indicate a range of nonconductive and semiconducting (i.e., conductivity of $10^{-8}$ S-cm$^{-1}$ or less) organic solvents and polymers of dielectric constant below about 22. "Polymers" include solids, melts and prepolymers (oligomers).

In one general aspect, this invention provides transparent electrodes formed of electrically conducting substrated polymeric compositions comprising polyaniline of film and fiber-forming molecular weight, a substrate and functionalized protonic acid in which the counterion has been functionalized to be compatible with the substrate. The substrate can be nonconductive or semiconductive solid polymer. It can be this polymer in melted (molten) form. It can separately or in addition be organic solvent which can be partially or completely removed during processing. As used herein, a "functionalized protonic acid" is a protonic acid, generally denoted as $H^+(M^--R_p)$, in which the counter-ion anionic species, $(M^--R_p)$, contains $R_p$ which is a functional group or a connection to a polymer backbone which is chosen to be compatible with the substrate. Typically the substrate is nonpolar or weakly polar.

In a more specific aspect of the invention, the transparent conductor is fabricated with polyaniline (PANi) which has been protonated to the conducting emeraldine salt form using camphor-sulfonic acid (CSA) as the functionalized protonic acid; said conducting polyaniline complex (protonated polyaniline/camphor-sulfonic acid) being soluble in meta-cresol. The conducting polyaniline complex is co-dissolved in meta-cresol at a desired ratio, for example 5% w/w polyaniline complex to meta-cresol, with a non-conductive bulk polymer, poly(methyl-methacrylate) (PMMA), at a desired ratio, for example 50% w/w PMMA to meta-cresol, to form a solution of the polyblend, polyaniline complex with PMMA. The solution is then spin-cast onto a suitable substrate to yield an optical quality transparent film thin conducting polyblend film electrode with final composition 10% w/w polyaniline complex to PMMA. The concentrations of either of the final components can be varied and controlled by changing the concentrations in the pre-prepared solution prior to spin-casting onto the substrate.

Specific advantages of the transparent conductor of this invention over the prior art include the following:

(i) Because the transparent conducting body, coating or film is a stable soluble polymer blend, the conducting transparent film can be applied by casting from solution (for example, spin-casting, drop-casting, etc). This can be carried out in ambient atmosphere with no need for vacuum technology.

(ii) Since the transparent conductor is cast onto the substrate directly from solution, said material can be cast onto complex, curved surfaces.

(iii) The precise chemical stoichiometry is pre-determined by the concentrations of the conducting polyaniline complex and the PMMA in the solution used for casting the electrode film. Thus, the manufacture of transparent conducting films for electrode applications and the like is routine.

(iii) Transparent conducting materials fabricated from the conducting polyaniline complex/PMMA polyblends are flexible and mechanically robust. Thus, when applied onto flexible support surfaces (for example onto free standing polymer films) the coated surfaces are robust.

(iv) Since transparent conducting films fabricated from the conducting polyaniline complex/polymer polyblends are re-soluble in common organic solvents, transparent electrodes and other conductor forms can be patterned using photo-lithographic techniques; said techniques being, for example, routinely used in the semiconductor industry.

BRIEF DESCRIPTION OF THE DRAWINGS

This invention will be further described with reference being made to the accompanying drawings in which.

DETAILED DESCRIPTION OF THE INVENTION

Figure 1:
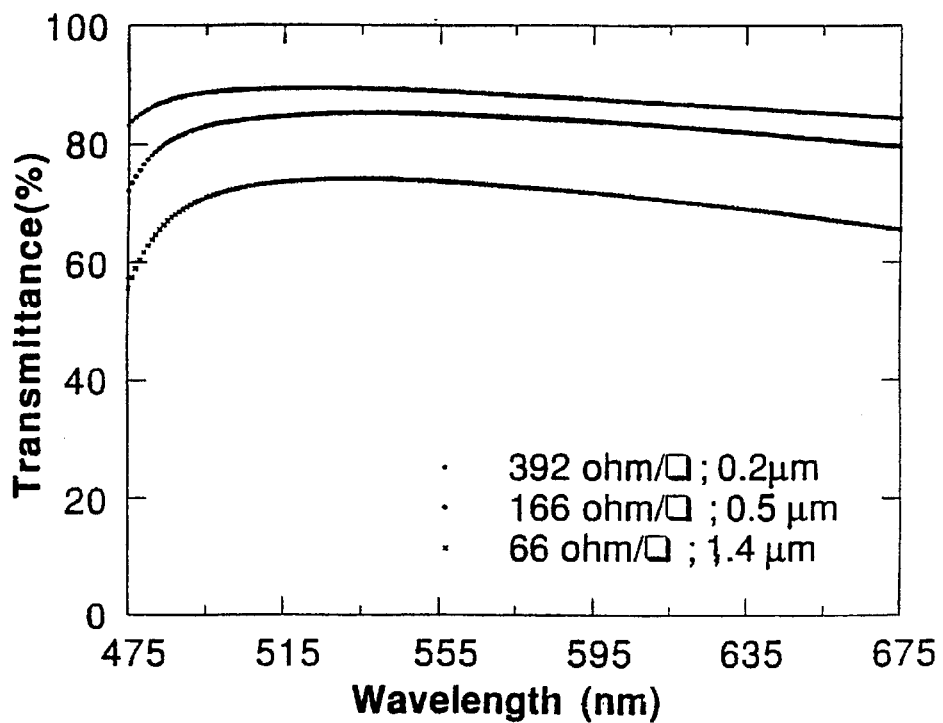
FIG. 1 is a series of visible transmittance spectrographs for three PANi/CSA films.

The transparent conductors of this invention include two or three types of ingredients.

(i) One or more substituted or unsubstituted polyanilines;

(ii) An organic substrate phase. This can be an organic liquid such as a solvent or a prepolymer. It can also be an organic solid or semisolid which is meltable during the electrode fabrication such as melted or softened polymer. In a special circumstance it can be the protonic acid (iii) when it is a liquid and not overly polar in overall character-i.e., when it has a large nonpolar region. It can be mixtures of two or more of these materials. The substrate, when a solvent, may be present during fabrication and removed at least partially in the final product.

(iii) One or more functionalized protonic acid solutes in which the counter-ion has been functionalized to be compatible with the substrate.

The Polyaniline:

One ingredient is substituted or unsubstituted polyaniline. When the term "polyaniline" is used in this application, it is used generically to include substituted and unsubstituted materials, unless the context is clear that only the specific nonsubstituted form is intended. In general, polyanilines for use in the invention are polymers and copolymers of film and fiber-forming molecular weight derived from the polymerization of unsubstituted and substituted anilines of the Formula I:

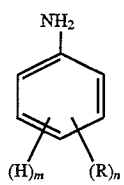

Formula I wherein n is an integer from 0 to 4;

m is an integer from 1 to 5 with the proviso that the sum of n and m is equal to 5; and R is independently selected so as to be the same or different at each occurrence and is selected from the group consisting of alkyl, alkenyl, alkoxy, cycloalkyl, cycloalkenyl, alkanoyl, alkythio, aryloxy, alkylthioalkyl, alkylaryl, arylalkyl, amino, alkylamino, dialkytamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more sulfonic aid, carboxylic acid, halo, nitro, cyano or expoly moieties; or carboxylic acid, halogen, nitro, cyano, or sulfonic acid moieties; or any two R groups together may form an alkylene or alkyenylene chain completing a 3, 4, 5, 6 or 7-membered aromatic or allcyclic ring, which ring may optionally include one or more divalent nitrogen, sulfur or oxygen atoms. Without intending to limit the scope of this invention, the size of the various R groups ranges from about 1 carbon (in the case of alkyl) through 2 or more carbons up through about 20 carbons with the total of n Rs being from about 1 to about 40 carbons.

Illustrative of the polyanilines useful in the practice of this invention are those of the Formula II to V:

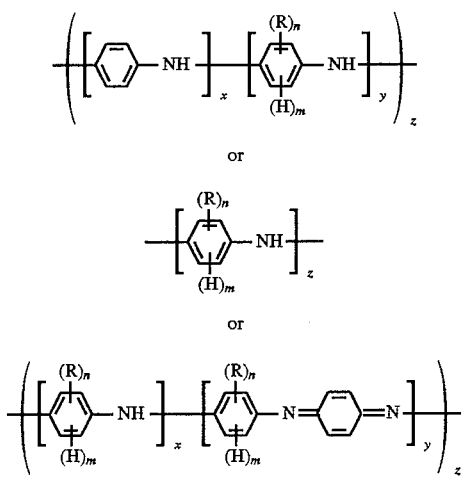

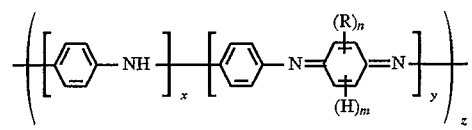

wherein:

n, m and R are as described above except that m is reduced by 1 as a hydrogen is replaced with a covalent bond in the polymerization and the sum of n plus m equals 4;

y is an integer equal to or greater than 0;

x is an integer equal to or greater than 1, with the proviso that the sum of x and y is greater than 1; and z is an integer equal to or greater than 1.

The following listing of substituted and unsubstituted anilines are illustrative of those which can be used to prepare polymers and copolymers useful in the practice of this invention.

| | |
|---|---|
| Aniline | 2,5-Dimethylaniline |
| o-Toluidine | 2,3-Dimethylaniline |
| m-Toluidine | 2,5-Dibutylaniline |
| o-Ethylaniline | 2,5-Dimethoxyaniline |
| m-Ethylaniline | Tetrahydronaphthylamine |
| o-Ethoxyaniline | o-Cyanoaniline |
| m-Butylaniline | 2-Thiomethylaniline |
| m-Hexylaniline | 2,5-Dichloroaniline |
| m-Octylaniline | 3-(n-Butanesulfonic acid) |
| 4-Bromoaniline | aniline |
| 2-Bromoaniline | |
| 3-Bromoaniline | 2,4-Dimethoxyaniline |
| 3-Acetamidoaniline | 4-Mercaptoaniline |
| 4-Acetamidoaniline | 4-Methylthioaniline |
| 5-Chloro-2-methoxyaniline | 3-Phenoxyaniline |
| 5-Chloro-2-ethoxyaniline | 4-Phenoxyaniline |

Illustrative of useful R groups are alkyl, such as methyl, ethyl, octyl, nonyl, tert-butyl, neopentyl, isopropyl, sec-butyl, dodecyl and the like, alkenyl such as 1-propenyl, 1-butenyl, 1-pentenyl, 1-hexenyl, 1-heptenyl, 1-octenyl and the like; alkoxy such as propoxy, butoxy, methoxy, isopropoxy, pentoxy, nonoxy, ethoxy, octoxy, and the like, cycloalkenyl such as cyclohexenyl, cyclopentenyl and the like; alkanoyl such as butanoyl, pentanoyl, octanoyl, ethanoyl, propanoyl and the like; alkylsulfinyl, alkysulfonyl, alkylthio, arylsulfonyl, arylsulfinyl, and the like, such as butylthio, neopentylthio, methylsulfinyl, benzylsulfinyl, phenylsulfinyl, propylthio, octylthio, nonylsulfonyl, octylsulfonyl, methylthio, isopropylthio, phenyisulfonyl, methylsulfonyl, nonylthio, phenylthio, ethylthio, benzylthio, phenethylthio, naphthylthio and the like; alkoxycarbonyl such as methoxycarbonyl, ethoxycarbonyl, butoxycarbonyl and the like, cycloalkyl such as cyclohexyl, cyclopentyl, cyclooctyl, cycloheptyl and the like; alkoxyalkyl such as methoxymethyl, ethoxymethyl, butoxymethyl, propoxyethyl, pentoxybutyl and the like; aryloxyalkyl and aryloxyaryl such as phenoxyphenyl, phenoxymethylene and the like; and various substituted alkyl and aryl groups such as 1-hydroxybutyl, 1-aminobutyl, 1-hydroxylpropyl, 1-hydyroxypentyl, 1-hydroxyoctyl, 1-hydroxyethyl, 2-nitroethyl, trifluoromethyl, 3,4-epoxybutyl, cyanomethyl, 3-chloropropyl, 4-nitrophenyl, 3-cyanophenyl, and the like; sulfonic acid terminated alkyl and aryl groups and carboxylic acid terminated alkyl and aryl groups such as ethylsulfonic acid, propylsulfonic acid, butylsulfonic acid, phenylsulfonic acid, and the corresponding carboxylic acids.

Also illustrative of useful R groups are divalent moieties formed from any two R groups such as moieties of the formula:

—(CH$_2$)—$_{n^*}$ wherein n* is an integer from about 3 to about 7, as for example —(CH$_2$)—$_4$, —(CH$_2$)—$_3$ and —(CH$_2$)—$_5$, or such moieties which optionally include heteroatoms of oxygen and sulfur such as —CH$_2$SCH$_2$— and —CH$_2$—O—CH$_2$—. Exemplary of other useful R groups are divalent alkenylene chains including 1 to about 3 conjugated double bond unsaturation such as divalent 1,3-butadiene and like moieties.

Preferred for use in the practice of this invention are polyanilines of the above Formulas II to V in which:

n is an integer from 0 to about 2;

m is an integer from 2 to 4, with the proviso that the sum of n and m is equal to 4;

R is alkyl or alkoxy having from 1 to about 12 carbon atoms, cyano, halogen, or alkyl substituted with carboxylic acid or sulfonic acid substituents;

x is an integer equal to or greater than 1;

y is an integer equal to or greater than 0, with the proviso that the sum of x and y is greater than about 4, and z is an integer equal to or greater than about 5.

Particularly preferred for use in the practice of this invention are polyanilines of the above Formulas II to V in which:

n is an integer from 0 to 2;

m is an integer from 2 to 4, with the proviso that the sum of n and m is equal to 4;

R is alkyl or alkoxy having from 1 to about 4 carbon atoms or alkyl substituted with carboxylic acid or sulfonic acid substituents;

x is an integer equal to or greater than 1;

y is an integer equal to or greater than 0, with the proviso that the sum of x and y is greater than about 6; and z is an integer equal to or greater than about 10.

Amongst the particularly preferred embodiments, most preferred for use in the practice of this invention are polyanilines of the above Formulas II to V in which:

n is an integer, 0 or 1;

m is an integer, 3 or 4, with the proviso that the sum of n and m is equal to 4;

R is alkyl or alkoxyl from 1 to about 4 carbon atoms;

x is an integer equal to or greater than 2;

y is an integer equal to or greater than 1, with the proviso that the sum of x and y is greater than about 8; and z is an integer equal to or greater than about 15.

In the most preferred embodiments of this invention, the polyaniline is derived from unsubstituted aniline, i.e., where n is 0 and m is 5 (monomer) or 4 (polymer).

In general, the polyanilines particularly useful in the practice of this invention are those which are of "film and fiber forming molecular weight." As used herein, "film and fiber forming molecular weight" generally means number average molecular weights which exceed about 10,000 daltons. Solutions of such soluble polymers generally can be cast to form electrodes which thin, freestanding films or extruded into films and fibers which are coherent and retain their shape, and preferably are not brittle when bent.

In general, an advantage of this invention is that substituted and unsubstituted polyanilines in the protonated conducting form may be dissolved in organic liquids and such polyanilines have more than 8 monomer repeat units as for example those polyanilines described in U.S. Pat. Nos. 3,963,498 and 4,025,463. Because of the higher molecular weight, these substituted and unsubstituted polyanilines can be coated onto ssurfaces without the need for binders, i.e., polymer compositions which bind and improve the stability of the polyanilines which is not generally true of the low molecular weight oligomeric polyanilines described in U.S. Pat. Nos. 3,963,498 and 4,025,463. The molecular weight of the substituted or unsubstituted polyaniline at which the polymer will be film or fiber forming may vary widely, depending on a number of factors including the number of repeat units, and the number of substituents and the substituent pattern. In general, substituted and unsubstituted polyanilines will be of film and fiber forming molecular weight where the number of monomer repeat units is at least about 50. In the preferred embodiments of the invention, the number of repeat units is at least about 75, and in the particularly preferred embodiments, the number of repeat units is at least about 200. Amongst the particularly preferred embodiments, most preferred are those embodiments in which the number of repeat units is at least about 250.

The polyaniline can be conveniently used in the practice of this invention in any of its physical forms. illustrative of useful forms are those described in Green, A. G., and Woodhead, A. E., "Aniline-black and Allied Compounds, Part 1," *J. Chem. Soc.*, Vol. 101, pp. 1117 (1912) and Kobayashi, et al., "Electrochemical Reactions ... of Polyaniline Film-Coated Electrodes," *J. Electroanl. Chem.*, Vol. 177, pp. 281–91 (1984), which are hereby incorporated by reference. For unsubstituted polyaniline, useful forms include leucoemeraldine, protoemeraldine, emeraldine, nigraniline and tolu-protoemeraldine forms.

Useful polyanilines can be prepared through use of chemical synthetic procedures. For example, one form of polyaniline having at least about 160 repeat units can be prepared by treating aniline with ammonium persulfate (NH$_4$)$_2$S$_2$O$_8$ in excess 1M HCl. This powdered form of polyaniline is blue green in color. After methanol washing and air drying this material exhibits a conductivity of about 10 S-cm$^{-1}$. This conductive form of polyaniline can be treated with ammonium hydroxide in ethanol to form a nonconductive form of polyaniline which is purple in color and which has a conductivity of less than 10$^{-8}$ S-cm$^{-1}$. Other chemical procedures for preparation of various chemical forms of polyaniline are described in detail in Green et al. described above.

Useful forms of polyaniline can also be prepared electrochemically. For example, useful forms of polyaniline can be prepared by the electrochemical oxidation of aniline in aqueous fluoroboric acid electrolyte on a platinum foil anode.

Other chemical and electrochemical syntheses and transformations of the conductive form of polyaniline may be discovered and are presently contemplated as being useful. Moreover, additional forms or types of polyaniline may be elucidated in the future. Accordingly, no limitation to the syntheses, transformation, or structures herein described or postulated is intended beyond the limitations of the appended claims.

The Functionalized Protonic Acid

A second ingredient of the conductive composition of this invention is a "functionalized protonic acid" in which the counter-ion has been functionalized to be compatible with nonconductive liquid or polymer substrates. As used herein, a "protonic acid" is an acid that protonates the polyaniline to form a complex with said polyaniline, which complex has a conductivity equal to or greater than about 10$^{-3}$ S-cm$^{-1}$ Protonic acids are well known as dopants in the conductive polymer art as shown by the reference to J.-C. Chiang and Alan G. MacDiarmid; and the reference to W. R. Salaneck et al., noted above, but are not necessarily compatible with nonconductive substrates such as nonpolar or weakly polar organic liquids. As used herein a "functionalized" protonic acid is an acid that protonates the polyaniline to form a complex with said polyaniline, which complex has a conductivity equal to or greater than about $10^{-3}$ S-cm$^{-1}$ and which has been functionalized to be miscible with or soluble in (as opposed to merely dispersible in) the substrate which makes up the third component of these products. In view of these properties, the acid can be considered a solute and the substrate a solvent.

This functionalization allows the polyaniline complex to be homogenized into the substrate through solubilization, or the like. This dissolving and/or intimate mixing leads to an essentially continuous network of the conductive species in the substrate. The substrate can be present as a discontinuous phase or preferably as a cocontinuous phase. This imparts a high level of conductivity to the overall composition—a conductivity many times higher than would be achieved if the conductive species were present as suspended particles or the like.

The substrate phases which are employed include organic liquids and/or melted polymers. In determining "compatibility" between a functionalized protonic acid and a substrate, the usual chemical solubility-miscibility rules are followed. For example with more polar substrates such as ketones or esters (as organic solvents) or poly(esters), poly (acylates) or poly(acids) as polymers-functionalization in the protonic acid counter-ion should promote or at minimum not substantially diminish the polar nature of the counterion group.

Conversely, with the preferred nonpolar or weakly polar substrates such as, for example, alkanes or aromatic hydrocarbons or halohydrocarbons as liquids or poly(olefins), vinyl polymers, such as polystyrene, polymethacrylates, or elastomers, such as ethylene propylene diene monomer copolymers as polymer substrates-functionalization should impart a nonpolar or weakly polar region to the counter-ion (for example adding a hydrocarbon tail to the counter-ion) so as to enhance or impart solubility of the counter-ion into the nonpolar substrate.

In one sense, in the case of nonpolar substrates, the acid is acting as a surfactant and thereby renders the polar counter-ion compatible with nonpolar or weakly polar organic substrates. In general, functionalized protonic acids for use in the invention are those of Formulas VI and VII:

$$A-R_1 \qquad \text{VI}$$

or

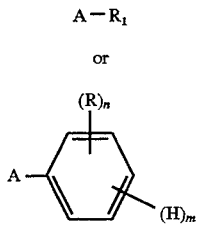

VII wherein:

A is sulfonic acid, selenic acid, phosphonic acid, boric acid or a carboxylic acid group; or hydrogen sulfate, hydrogen selenate, hydrogen phosphate;

n is an integer from 0 to 5;

m is an integer from 0 to 4 with the proviso that the sum of n and m is 5;

$R_1$ is alkyl, alkenyl, alkoxy, alkanoyl, alkylthio, alkylthioalkyl, having from 1 to about 20 carbon atoms; or alkylaryl, arylalkyl, alkylsulfinyl, alkoxyalkyl, alkylsulfonyl, alkoxycarbonyl, carboxylic acid, where the alkyl or alkoxy has from 0 to about 20 carbon atoms; or alkyl having from 3 to about 20 carbon atoms substituted with one or more sulfonic acid, carboxylic acid, halogen, nitro, cyano, diazo, or epoxy moieties; or a substituted or unsubstituted 3, 4, 5, 6 or 7 membered aromatic or alicyclic carbon ring, which ring may include one or more divalent heteroatoms of nitrogen, sulfur, sulfinyl, sulfonyl or oxygen such as thiophenyl, pyrolyl, furanyl, pyridinyl.

In addition to these monomeric acid forms, $R_1$ can be a polymeric backbone from which depend a plurality of acid functions "A." Examples of polymeric acids include sulfonated polystyrene, sulfonated polyethylene and the like. In these cases the polymer backbone can be selected either to enhance solubility in nonpolar substrates or be soluble in more highly polar substrates in which materials such as polymers, polyacrylic acid or poly(vinylsulfonate), or the like, can be used.

R* is the same or different at each occurrence and is alkyl, alkenyl, alkoxy, cycloalkyl, cycloalkenyl, alkanoyl, alkylthio, aryloxy, alkylthioalkyl, alkylaryl, arylalkyl, alkylsulfinyl, alkoxyalkyl, alkylsulfonyl, aryl, arylthio, arylsulfinyl, alkoxycarbonyl, arylsulfonyl, carboxylic acid, halogen, cyano, or alkyl substituted with one or more sulfonic acid, carboxylic acid, halogen, nitro, cyano, diazo or epoxy moieties; or any two R* substituents taken together are an alkylene or alkenylene group completing a 3, 4, 5, 6 or 7 membered aromatic or alicyclic carbon ring or multiples thereof, which ring or rings may include one or more divalent heteroatoms of nitrogen, sulfur, sulfinyl, sulfonyl or oxygen. R typically has from about 1 to about 20 carbons especially 3 to 20 and more especially from about 8 to 20 carbons. It will be appreciated that the depiction of the acids as A-$R_1$ is equivalent to their earlier depiction as H$^+$(M$^-$-$R_p$) and that the

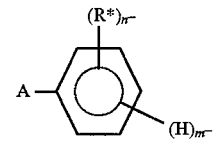

acids fall within the general structure of A-$R_1$.

Preferred for use in the practice of this invention are functionalized protonic acid solutes of the above Formulas VI and VII in which:

A is sulfonic acid, phosphonic acid or carboxylic acid;

n* is an integer from 1 to 5;

m* is an integer from 0 to 4 with the proviso that the sum of n and m is 5;

$R_1$ is alkyl, alkenyl, alkoxy, alkanoyl, alkylthio, alkylthioalkyl, having from 5 to about 16 carbon atoms; or alkylaryl, arylalkyl, alkylsulfinyl, alkoxyalkyl, alkylsulfonyl, alkoxycarbonyl, carboxylic acid, where the alkyl or alkoxy has from 1 to about 20 carbon atoms; or alkyl having from 3 to about 20 carbon atoms substituted with one or more sulfonic acid, carboxylic acid, halogen, nitro, cyano, diazo, or epoxy moieties;

R* is the same or different at each occurrence and is alkyl, alkenyl, alkoxy, arylalkyl, alkylsulfonyl, alkoxycarbonyl or carboxylic acid having from 3 to 12 carbon atoms, or alkyl substituted with one or more carboxylic acid, halogen, diazo or epoxy moieties;

Particularly preferred for use in the practice of this invention are functionalized protonic acid solutes of the above Formulas VI and VII in which:

A is sulfonic acid or carboxylic acid;

n* is an integer from 1 to 3;

m* is an integer from 0 to 4 with the proviso that the sum of n and m is 5;

$R_1$ is alkyl, alkenyl, alkoxy, having from 6 to about 14 carbon atoms; or arylalkyl, where the alkyl or alkyl portion or alkoxy has from 4 to about 14 carbon atoms; or alkyl having from 6 to about 14 carbon atoms substituted with one or more, carboxylic acid, halogen, diazo, or epoxy moieties;

R* is the same or different at each occurrence and is alkyl, alkoxy, alkylsulfonyl, having from 4 to 14 carbon atoms, or alkyl substituted with one or more halogen moieties again with from 4 to 14 carbons in the alkyl.

Among the particularly preferred embodiments, most preferred for use in the practice of this invention are functionalized protonic acid solutes of the above Formulas VI and VII in which:

A is sulfonic acid;

$n^*$ is the integer 1 or 2;

$m^*$ is the integer 3 or 4 with the proviso that the sum of n and m is 5;

$R_1$ is alkyl or alkoxy, having from 6 to about 14 carbon atoms; or alkyl having from 6 to about 14 carbon atoms substituted with one or more halogen moieties;

R* is alkyl or alkoxy, having from 4 to 14, especially 12 carbon atoms, or alkyl substituted with one or more halogen, moieties.

In the most preferred embodiments of this invention, the functionalized protonic acid solute is dodecylbenzene sulfonic acid.

The amount of functionalized protonic acid employed can vary depending on the degree of conductivity required. In general, sufficient functionalized protonic acid is added to the polyaniline-containing admixture to form a conducting material. Usually the amount of functionalized protonic acid employed is at least sufficient to give a conductive polymer (either in solution or in solid form) having a conductivity of at least about $10^{-9}$ S-cm$^{-1}$. As a general rule, the amount needed will be much lower, i.e., 10% by weight (basis overall composition) or less than would be expected to impart the desired conductivity. This is because the functionalized counter-ion of the protonic acid is dissolved or intimately mixed in the substrate rather than merely dispersed or suspended in it. The upper level of conductivity is not critical and may depend on the type of aniline polymer employed. In general, the highest level of conductivity obtained is provided without unduly adversely affecting the environmental stability of the polymer. In the preferred embodiments of the invention the amount of functionalized protonic acid employed is sufficient to provide a conductivity of at least about $10^{-8}$ S-cm$^{-1}$ and in the particularly preferred embodiments is sufficient to provide a conductivity of at least about $10^{-6}$ S-cm$^{-1}$. Amongst these preferred embodiments, most preferred are those embodiments in which unsubstituted polyaniline is employed and in which a sufficient amount of acid is employed to provide a conductivity of at least about $10^{-4}$ S-cm$^{-1}$.

The Substrate

A third component of the materials from which the conductors of this invention are formed is the substrate. This can be an organic solvent, or it can be bulk oligomeric or polymeric or prepolymeric materials which can be put into a fluid (liquid or semisolid) form during processing so as to achieve the required intimate mixture (solution or the like) with the polyaniline and dopant. In the case of nonpolar counter-ions, it is preferred to use nonpolar or weakly polar solvents or polymers as substrates. As used herein the terms "nonpolar or weakly polar organic solvent, or oligomeric or polymer liquid" and the like refer to a material which is or can be rendered fluid by melting and which has a dielectric constant at room temperature equal to or less than about 22. Preferred of these substrates are those common organic solvents, or meltable oligomers or polymers with dielectric constants equal to or less than about 15. Especially preferred nonpolar substrates are those solvents, or oligomers or polymers with dielectric constants equal to or less than about 10.

Illustrative of useful common solvents are the following materials: substituted or unsubstituted aromatic hydrocarbons such as benzene, toluene, p-xylene, m-xylene, naphthalene, ethylbenzene, styrene, aniline and the like; higher alkanes such as pentane, hexane, heptane, octane, nonane, decane and the like; cyclic alkanes such as decahydronaphthalene; halogenated alkanes such as chloroform, bromoform, dichloromethane and the like; halogenated aromatic hydrocarbons such as chlorobenzene, o-dichlorobenzene, m-dichlorobenzene, p-dichlorobenzene and the like; higher alcohols such as 2-butanol, 1-butanol, hexanol, pentanol, decanol, 2-methyl-1-propanol and the like; higher ketones such as hexanone, butanone, pentanone and the like; heterocyclics such as morpholine; perfluorinated hydrocarbons such as perfluorodecaline, perfluorobenzene and the like. Mixtures of such nonpolar organic solvents can also be used, such as mixtures of xylene and chlorobenzene.

Examples of semiconducting materials (i.e., materials with conductivities-of $10^{-8}$ S-cm$^{-1}$) include undoped or lightly doped conjugated homo- or copolymers such as polythiophenes, polypyrroles, polyacetylenes, polyparaphenylene sulfide, poly(paraphenylene vinylenes), and the like.

Other useful substrates include liquofiable (meltable) bulk oligomers or polymers. Illustrative of useful oligomeric liquids are liquifiable higher alkanes such as hexatriacontane, dotriadecane, octadodecane; branched higher alkanes and waxes, and perfluorinated higher alkanes and waxes. Illustrative of useful polymeric substrates are liquifiable polyethylenes, isotactic polypropylene, polystyrene, poly(vinylalcohol), poly(ethylvinylacetate), polybutadienes, polyisoprenes, ethylenevinylenecopolymers, ethylene-propylene copolymers, poly (ethyleneterephthalate), poly(butyleneterephthalate) and nylons such as nylon 12, nylon 8, nylon 6, nylon 6.6 and the like. Mixtures of organic solvents plus polymers may be used in which case the solvent can serve as a plasticizer for the polymer.

Organic substrates selected for use in any particular situation will depend primarily on the various R substituents of the polyaniline, and/or of the functionalized protonic acid, and/or one or more other polymers that are selected to form a blend with the substituted or unsubstituted polyaniline. In general, less polar substituents and/or less polar other polymers used the preparation of polyblends, will require lower dielectric constants. Conversely, more polar substituents and/or more polar other polymers used the preparation of composites or polyblends, will require higher dielectric constants.

Preferred common organic solvents are toluene, xylenes, styrene, aniline, decahydronaphthalene, chloroform, dichloromethane, chlorobenzenes, morpholine, and particularly preferred solvents are toluene, xylenes, decahydronaphthalene, and chloroform. These embodiments include aromatic hydrocarbons such as xylene, and halogenated hydrocarbons such as chloroform.

Overall Proportions

The proportions of materials are not critical and can vary widely. However, the following guidelines are believed important for achieving materials particularly useful in the present invention. In general, the amount of solvent substrate as a proportion of the amount of solution is not believed to be critical, since any amount as a liquid or semisolid will form at least a viscous gel with the protonated conductive polymers. These viscous embodiments of the invention are particularly useful for silkscreening conductive circuitry and for applying thick film coating on substrates. For other applications, it may be preferred, however, to use sufficient liquid solvent to lower the viscosity of the gel or solution to a point where it flows at least sufficiently to conform to a container shape or mold in a reasonably short period of time, e.g., in 30 minutes or less; or the be extruded into films and fibers. Preferably, the liquid is present in sufficient amounts to lower the viscosity of the solution to less than about 10,000 centipoise, and more preferably from about 1 to about 1000 centipoise.

As just described the conductive polymer compositions of this invention include polyaniline, protonic acid, and solvent or plasticizer substrate (which can be protonic acid in some cases as already noted). The relative proportions of these materials can range as follows.

Polyaniline 1 part by weight.

Protonic acid From at least 1 protonic acid proton for each 10 repeat units of aniline and preferably at least one for each 8 repeat units up to 20 protonic acid protons for each aniline repeat unit-typically from 0.01 parts to 20 parts by weight.

Substrate 0.1 parts to 200 parts, (including excess especially 0.2 to 100 parts. acid)

In addition to the polyaniline homopolymer or copolymer, functionalized protonic acid and substrate, the compositions used in this invention can include other optional ingredients which either dissolve or do not dissolve in the composition. The nature of such optional ingredients can vary widely, and include those materials which are known to those of skill in the art for inclusion in polymer articles. In the case of dissolvable components, materials may be present which alter the physical or mechanical properties of either the solution or the articles eventually derived from the solution, provided that these materials are in a form known to the art to be transparent. Examples of such materials include other conventional polymers such as polycarbonate, polyacrylonitrile, polyvinyl chloride, polyvinylidine chloride, polyvinyl alcohol, polyethylene oxide, polystyrene, nylon, cellulose acetate butyrate, polypropylene, polyethylene, polypropylene cellulose acetate, polyphenylene oxides and the like. In the case of non-soluble fourth components, materials may be present which either fill or form a base for the conductive polymer cast from the composition. These fourth components can include other conductive polymers, other polymers such as poly(3-alkylthiophenes) which may become conductive upon doping, reinforcing fibers and the like, so long as they do not render the products opaque or nontransparent. These other materials can be present in as much as 98% of the total mixture, and being optional can be omitted altogether. Usually, for commercially attractive electrode products these added polymers may make up 2% to 95% by weight of the total final product.

The method of forming the transparent conductors of this invention can vary widely. It is important, however, that at some stage the substrate be processed with the polyaniline and acid dopant in a fluid (liquid, semisolid, or molten form) to assure proper intimate admixture.

For example, one method of forming the present products containing the protonated aniline polymer and the functionalized counter-ions is to react, simultaneously, the aniline polymer, the functionalized protonic acid and the substrate solvent or polymer as a liquid. Thus, for example, by introducing polyaniline as a solid powder, m-cresol substrate as a liquid and (±)-10-camphor sulfonic acid (CSA) as a solid into a mixing vessel, a solution of the protonated conductive polymer is formed, from which conductive electrodes can be cast. The conditions of such mixing are not critical, provided that sufficient CSA is used to dope the desired quantity of polymer and sufficient solvent is employed to reduce the viscosity of the solution to manageable levels.

An alternate technique of preparing the product of this invention containing the protonated conductive polymer is to mix first the polymer and the solvent, thereafter add the functionaiized protonic acid to the solution or two phase system. Thus, for example, if polyaniline powder is admixed with m-cresol solvent, the powder will remain suspended in the solvent for extended periods under normal conditions. The addition of a functionalized protonic acid to this suspension, such as CSA, causes the powder to be protonated and, thereafter, causes the protonated conductive polymer to go into solution.

In another preferred method, the solid polymer powder is first mixed with the functionalized protonic acid, such as CSA, which causes the polymer to be protonated. Subsequently, the protonated polymer is either melted and cast or admixed with, for example, m-cresol and a solution formed and cast.

Another preferred method for the preparation of solutions containing the polyaniline homopolymer or copolymer and the functionalized protonic acid is where the substrate polymer is synthesized directly in the presence of the functionalized protonic acid and in the non-polar or weakly polar solvent. This method is of special interest because the functionalized protonic acid acts as a surfactant in this emulsion polymerization, and yields high molecular weights of the polymers, and high conductivities of the resulting materials derived from the emulsions.

Various methods are contemplated for using the solution or melted composition. The solvent can be removed from the solution after casting the electrodes through use of any conventional solvent removal method but is removed preferably by evaporation. Alternatively, the solvent and unreacted functionalized protonic acid can be removed by extraction with an extractant in which the solvent and unreacted functionalized protonic acid are substantially more soluble than the doped polymer. If liquefied or molten oligomers or polymers are used as the substrate, solid conducting electrodes can be formed simply by cooling the liquid composition, as is commonly performed in injection molding, melt extrusion, etc. Alternatively, when polymerizable monomers are employed as the solvent, solid conducting articles can be formed by polymerizating the monomer. In the two latter methods removal of the solvent is not required.

As will be appreciated by those skilled in polymer processing, the ability to form shaped polymer articles by removing a solvent from a solution enables one to prepare electrodes of a wide variety of shapes and sizes. Thus, for example, by removing volatiles from the present composition spread on a surface, films of any desired thickness can be prepared. Extremely thin film electrodes can be prepared which are substantially transparent. By extruding the solution or melt through a die, fibers or films can be made. Similarly, by removing volatiles from the solution or melt in a mold of various shapes, shaped electrodes conforming in shape to the mold can be prepared. It will be appreciated that some shrinkage might occur between the solution in its last flowable state to the final article, but such shrinkage is conventionally accounted for in molding polymers from solution. It is also contemplated that, once a solution or melt is formed, a partial or substantial removal of solvent will occur prior to placing the solution or melt on a surface or in a mold, with the final venting of a solvent occurring on the surface or in the mold. It is contemplated that, if fourth or additional soluble components are introduced into the solution, they will, unless also volatile, be present in the shaped electrode formed. If the fourth component is a non-volatile liquid, then the removal of volatile components may leave a new liquid form of protonated conducting polymer. If the additional components are volatile, then foamed or expanded cellular forms of the polymer may be formed.

In the event that fourth or additional nonsoluble components are present (or suspended) in the solution or melt, the protonated conductive polymer will form around, or be filled with, the insoluble material. If, for example, the additional components are glass fibers, the relative amounts of fibers and protonated conductive polymer remaining will cause either the polymer to be fiber-filled, the fibers to be polymer coated or impregnated, or some intermediate composite of fibers and protonated conductive polymer to be formed.

It is also contemplated to use the present solutions or melt compositions as such as either transparent liquid conductors or liquid semiconductors, much in the manner that liquid mercury is used in various devices. Examples of such devices include gravity switches, fluid level detecting devices or other electrical or electronic switches.

The following specific examples are present to illustrate the invention and are not to be construed as limitations thereon.

EXAMPLES

Example I

In a general embodiment, the electrodes of the present invention can be prepared in three steps:

I-1) Preparation of the soluble conducting polyaniline complex consisting of polyaniline in the emeraldine salt form complexed with $(M^--R_p)$ as counter-ion where $H+(M^--R_p)$ is a functionalized protonic acid. An illustrative example would be $M^-=HSO_3^-$ $R_p$=camphor I-2) The soluble conducting polyaniline complex is co-dissoved with a desired amount of PMMA or any other suitable amorphous bulk polymer in a suitable organic solvent. The concentrations of the two comonents (the conducting polyaniline complex and, for example, the PMMA) are chosen so as to give a desired ratio in the final transparent conducting film after casting onto the base and evaporation of the solvent.

I-3) The transparent conducting film is then cast onto the base for use as a trasparent electrode, a transparent anti-static coating, etc. The detailed method of casting (spin-casting drop-casting, use of a doctor blade, etc.) is chosen to be consistent with secondary criteria (for example, ease of manufacture, cost, shape of substrate, etc)

Example II

An alternative route has two steps:

II-1) A polyblend of conducting substituted or unsubstituted polyaniline complex and PMMA (or another amorphous, melt-processible bulk polymer) is prepared using the methods described in I-1 and I-2 followed by evaporation of the solvent to yield a solid polyblend of the desired composition.

II-2) The transparent conducting film is applied by melting the conducting polyblend onto the desired surface.

This alternative has the specific advantage that the trasparent conducting electrode can be molded directly onto a base with a complex surface.

Example 1

Emeraldine base, 1.092 g, characterized in terms of molecular weight and the like by having an inherent viscosity of 1.2 dn/g when measured at room temperature as a 0.1% w solution in 97% $H_2SO_4$, (0.012M), was mixed with 1.394 g of CSA, (±)-10-camphorsulfonic acid, (Aldrich) using an agate mortar and pestle in inert atmosphere (i.e. in a glove-bag filled with nitrogen gas). The molar ratio of CSA to PhN repeat unit was 0.5. A quantity (1.275 g) of the resulting mixture was placed into 61.0 g of m-cresol, treated in an ultrasonic bath for 48 hours, and subsequently centrifuged. Most of the polyaniline-CSA complex dissolved to give a viscous deep green solution. Minor insoluble solids were removed by decanting. Part of the solution was set aside, weighed, and then cast onto a glass slide. After evaporation of the solvent, a flexible free-standing film was obtained; the film was weighed to calculate the content of the conductive polyaniline complex in said solution. The concentration was determined as 1.94%(w/w). This example demonstrates that solutions of conductive polyblends can be made and that said solutions can be used to cast conductive polyblend films.

Example 2

Example 1 was repeated, but with the CSA/PhN ratio varying over the following values: 0.6, 0.7, 0.8, 0.9, 1.0, 1.5, 2.0. To make the polyaniline-CSA solution. 0.138, 0.152, 0.166, 0.180, 0.194, 0.264, 0.334, g of each mixture were added into 10 g of m-cresol to keep the emeraldine content in each solution at 0.0006M in 10 g m-cresol. Complexes with CSA/PhN molar ratio equal or larger than 0.7 were completely soluble in m-cresol, thus centrifuge separation was not necessary for such solutions. Free-standing polyaniline films were obtained from all those solutions after casting onto glass slides and solvent evaporation. The resulting films were washed by acetone several times. During this process, most of excess CSA was removed from film, as was evident from the results of the compensation procedure. The compensation was done as follows: in each case, a small weighed piece of said free-standing PANi/CSA film was treated by 3% aq. $NH_4OH$ solution for two hours. The resulting neutral PANi (emeraldine base) films were washed with water and acetone. After drying in air, the films were weighed again. From the difference in weight before and after compensation, the content of CSA in the films was calculated as summarized in Table 1. The conductivities of the conducting PANi/CSA films were determined by the usual four probe method, in air, and are also listed in Table 1.

TABLE 1

Conductivity of Free-Standing Polyaniline-CSA Film

| CSA/PhN Ratio | | Conductivity |
|---|---|---|
| Initial in Solution | in Film | S/cm |
| 0.5 | 0.49 | 230 |
| 0.6 | 0.53 | 163 |
| 0.8 | 0.51 | 168 |
| 0.9 | 0.53 | 138 |
| 1.0 | 0.54 | 158 |
| 1.5 | 0.58 | 143 |
| 2.0 | 0.58 | 154 |

Example 3

Homogeneous and transparent PANi/CSA thin films were obtained when the solution of Example 1 was spin cast (10000 rpm, 2 min) onto glass or sapphire substrates. The surface resistivity of spin cast PANi/CSA thin film (ca. 0.55 µm) on glass substrate was ohms/square as determined by the four probe method. The surface resistivity of spin cast PANi/CSA thin film (ca. 1.4 µm) on glass substrate was 66 ohms/square as determined by the four probe method. FIG. 1 shows the transmission spectra of the two PANi/CSA films (ca. 0.55 µm thickness and 1.4 µm thickness) on a glass substrate. In the visible region the transmittance was 70–80% for the 1.4 µm thick film, and 75%–85% of the 0.55 µm film. This example demonstrates that conductive transparent films of the polyaniline complex can be cast from solution.

Example 4

Figure 2:
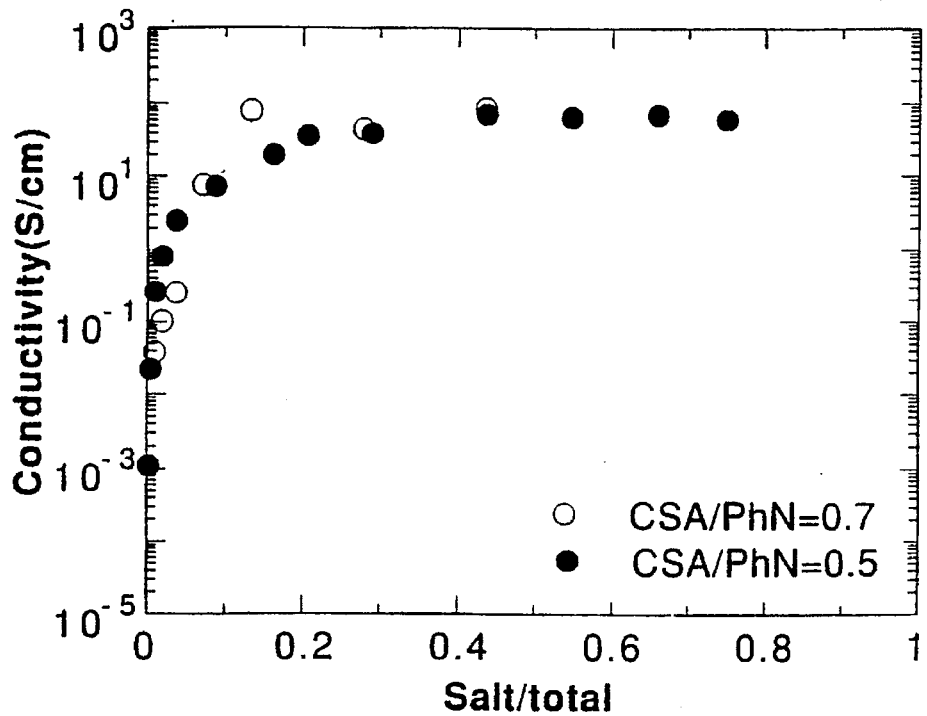
FIG. 2 is a graph of conductivity of PANi/CSA/PMMA films at various PANi concentrations.

A one (1) gram quantity of solution, prepared as in Example 1, was mixed with one (1) gram of 10%(w/w) solution of poly(methyl methacrylate), PMMA in m-cresol. The resulting homogeneous solution was spin-cast (10000 rpm, 2 min) onto a glass substrate. Subsequently, the substrate was put on a hot plate at 50° C., in air, to remove the remaining m-cresol from the film. The PANi/CSA complex content was 16.2% w/w (PANI/CSA to total polymer) in the film. Transparent free-standing blend films with said composition were prepared with thickness in the range 20–30 µm by casting the corresponding solution onto a glass slide. Similar experiments were repeated, but the polyaniline-CSA complex content was varied to be 75%, 66%, 54.8, 43.7%, 28.0%, 20.6%, 8.8%, 3.7%, 1.9%, 0.96%, 0.48%, and 0.24%. The surface resistance for the thin films on substrates and the bulk conductivity for the free-standing films were measured using the standard four-probe method; the conductivity results are summarized in FIG. 2.

Figure 3:
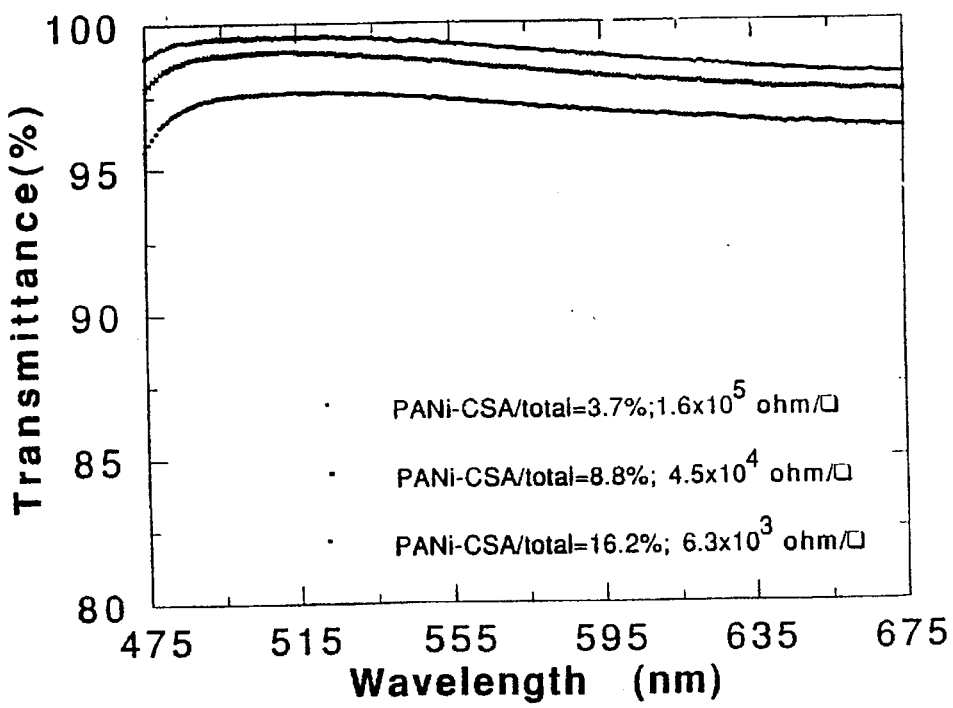
FIG. 3 is a series of visible transmittance spectrographs for PANi/CSA/PMMA films.
Figure 4:
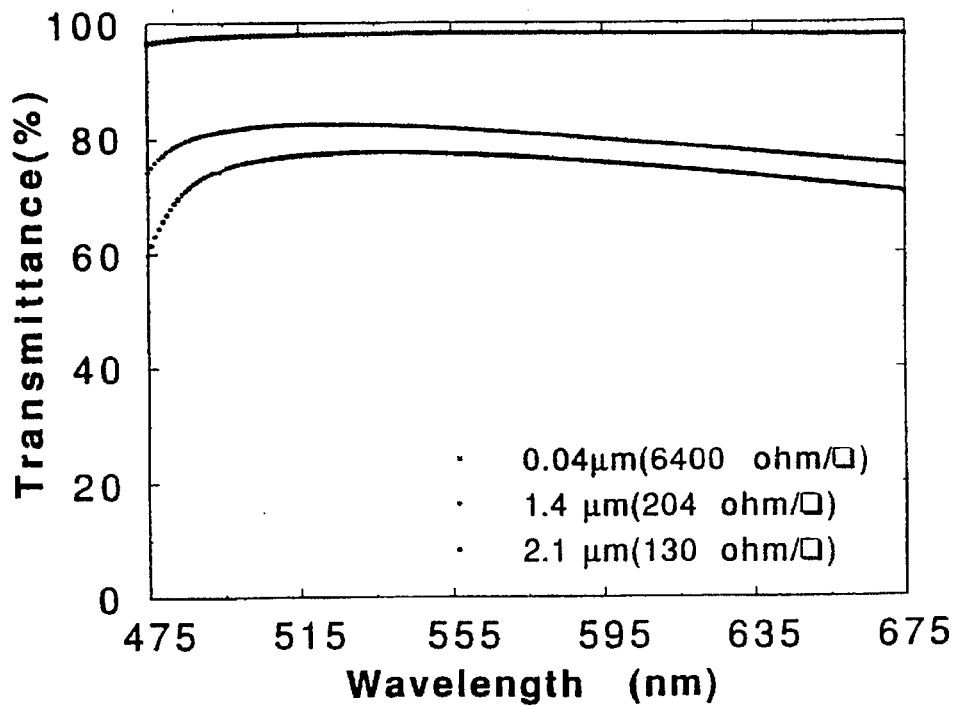
FIG. 4 is a series of visible transmittance spectrographs for different thickness PANi/CSA/PMMA films.
Figure 5:
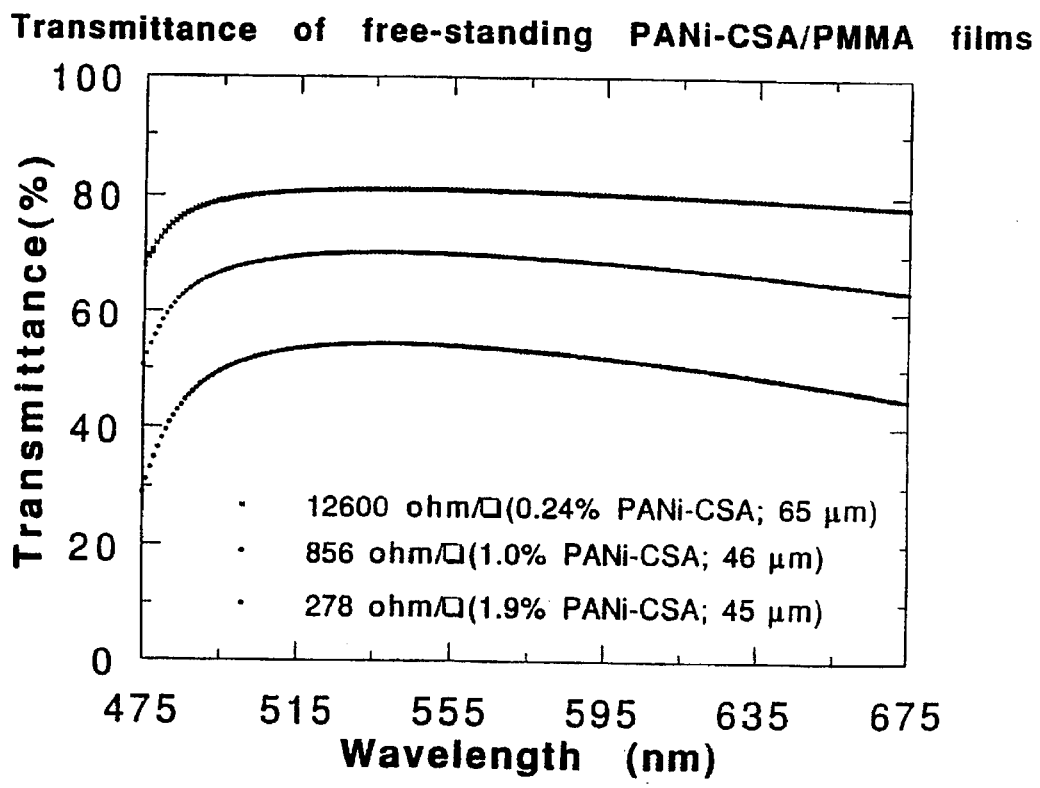
FIG. 5 is a series of visible transmittance spectrographs for PANi/CSA/PMMA films.

FIG. 3 shows the transmission spectra of the thin spin-cast films for PANI-CSA ratio of 16.2%, 8.8% and 3.7%, respectively. The surface resistance was $6.3\times10^3$, $4.5\times10^4$, and $16\times10^5$ ohms/square respectively. All of the spin-cast thin films exhibit transmission greater than 90% throughout the visible region of the spectrum. Increasing the thickness of the film leads to a decrease in surface resistance, as expected. FIG. 4 compares the transmission spectra of spin cast (onto glass substrates) films of different thickness with polyaniline-CSA content 20.6%. The thickest of these films (approx. 2.1 µm) of polyaniline-CSA complex with PMMA film exhibited excellent transparency in the visible region of the spectrum and a low surface resistance (130 ohms/square). Data for a number of free standing cast films (with thickness around 45–65 µm) are summarized in FIG. 5. This example demonstrates that conductive transparent films of the polyblends contaIning polyaniline complex at different concentrations in PMMA can be cast from solution.

Example 5

Figure 6:
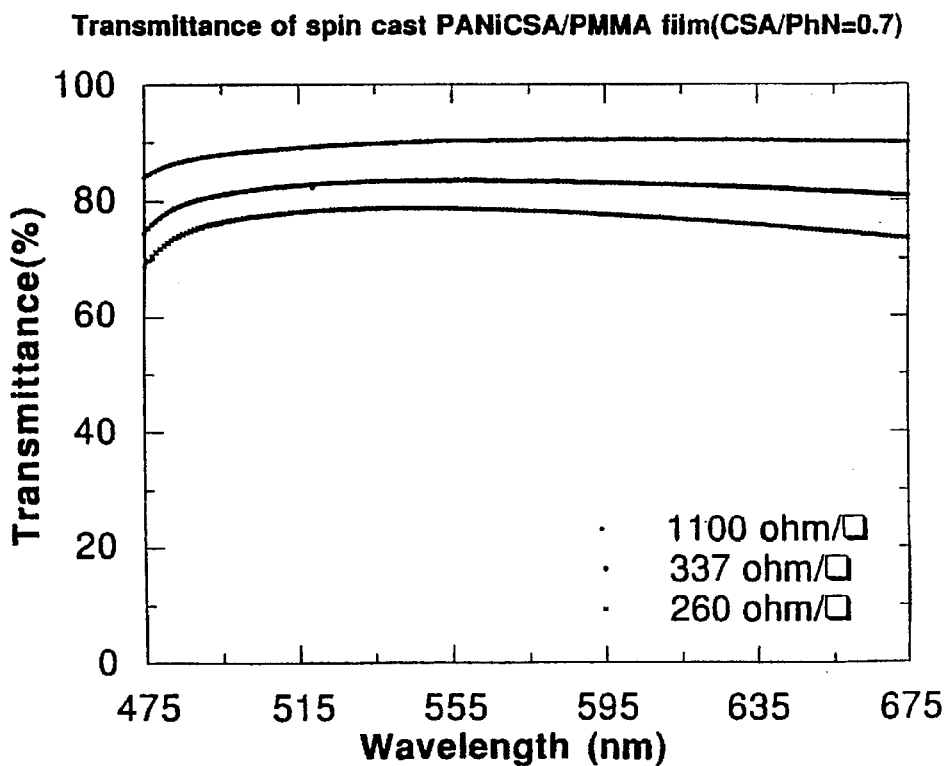
FIG. 6 is a series of visible transmittance spectrographs for PANi/CSA/PMMA films.

Example 4 was repeated, but with the CSA/PhN ratio fixed at 0.7; the polyaniline-CSA complex content was varied as follows: 43.6%, 27.8%, 13.4%, 7.2%, 3.72%, 1.9% and 0.96%, respectively. The bulk conductivity data for free-standing film are plotted in FIG. 2. Spin cast films exhibit excellent visible light transmission; two representative spectra are shown in FIG. 6. This example demonstrates that conductive transparent films of the polyblends contaIning polyaniline complex at different concentrations PMMA can be cast from solution.

Example 6

Figure 7:
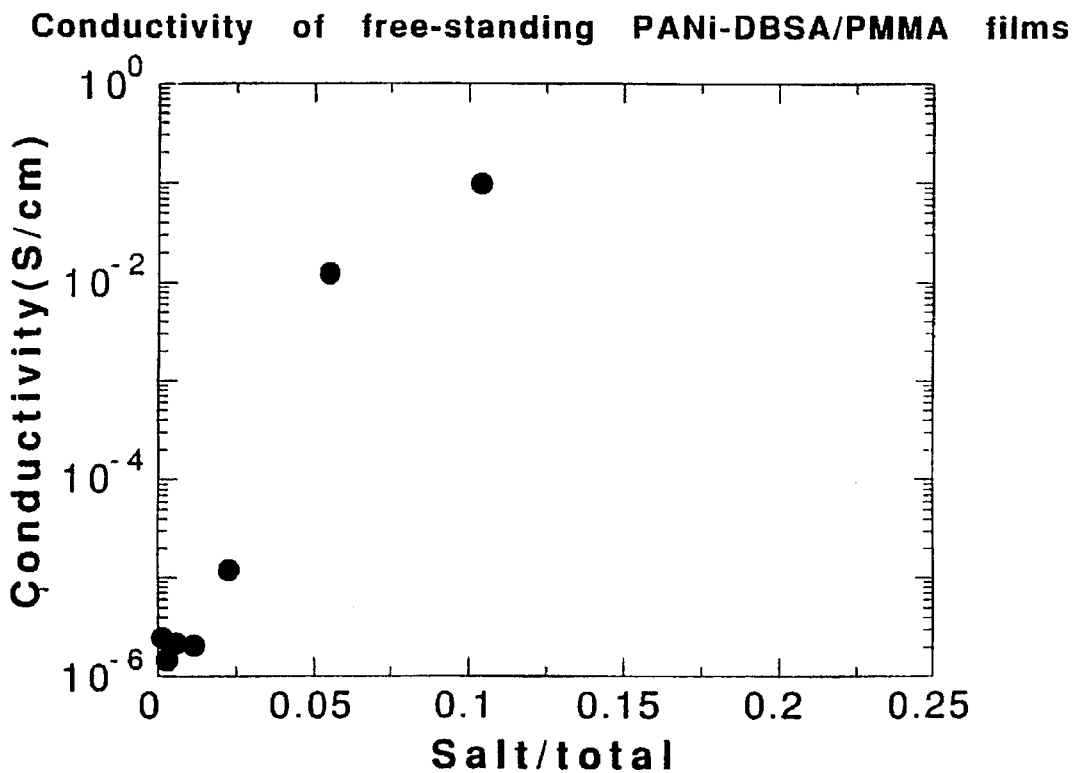
FIG. 7 is a graph of conductivity of PANi/CSA/PMMA films at various PANi concentrations.

Emeraldine base (2.18 g, 0.024M of PhN) was mixed thoroughly with 3.91 g (0.12M) of p-dodecylbenzenesulfonic acid (Tokyo Kasei) using an agate mortar and pestle in a glove bag filled with nitrogen. The molar ratio of DBSA to PhN repeat unit was 0.5. A solution of polyaniline/DBSA complex in chloroform was prepared by mixing of 0.2 g of the resulting polyaniline/DBSA complex with 0.2 g of additional DBSA and 20 g of chloroform. The mixture was treated in an ultrasonic bath for 24 hours and subsequently centrifuged. Insoluble solids were removed by decanting. The concentration of polyaniline/DBSA complex in the solution was 1.16% (w/w) as determined by weight change before and after removing solvent from a previously weighed solution. A 0.5 gram quantity of the resulting solution was mixed with 0.5 gram of 10% (w/w) solution of poly(methyl methacrylate), PMMA in chloroform. The resulting homogeneous solution was cast onto a glass slide to obtain a transparent freestanding film. The PANi/DBSA complex content in the film was 10.4% w/w (PANI/DBSA to total polymer). Similar experiments were repeated, but the polyaniline-CSA complex content was varied to be 5.5%, 2.3%, 1.2%, 0.6%, 0.3%, 0.1%. Conductivity data measured by the four probe technique are shown in FIG. 7. All these films exhibit good transparency in visible region.

Example 7

Figure 8:
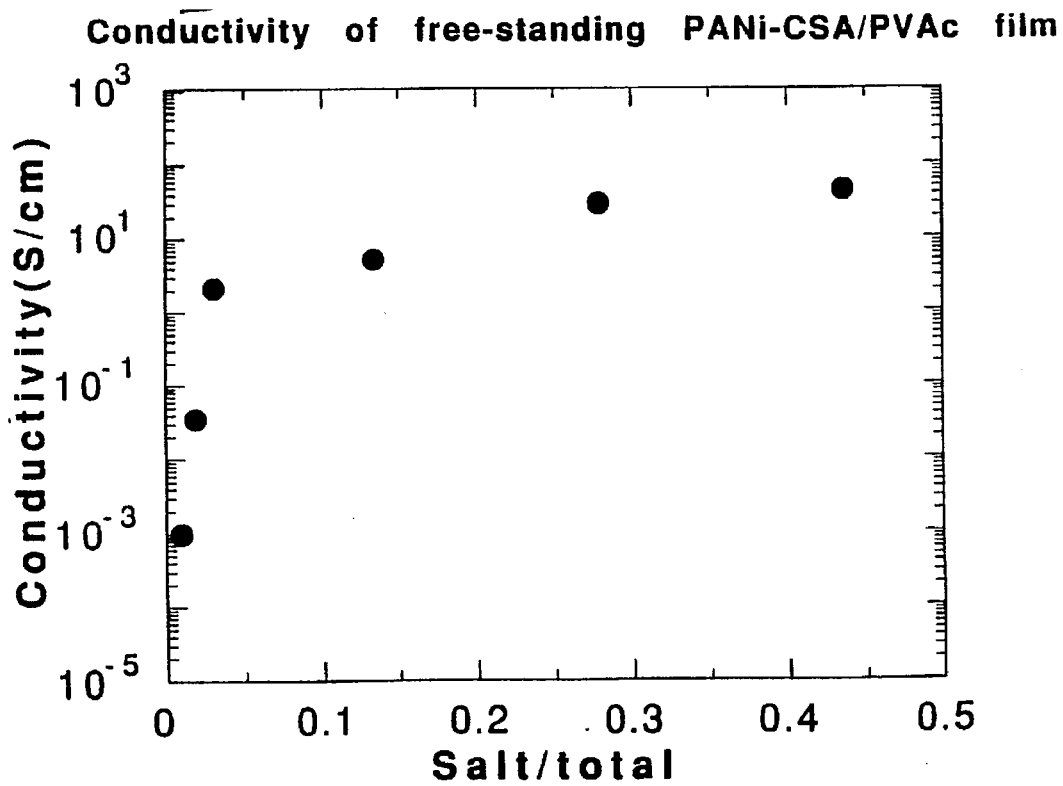
FIG. 8 is a graph of conductivity of PANi/CSA/PVAc films at various PANi concentrations.
Figure 9:
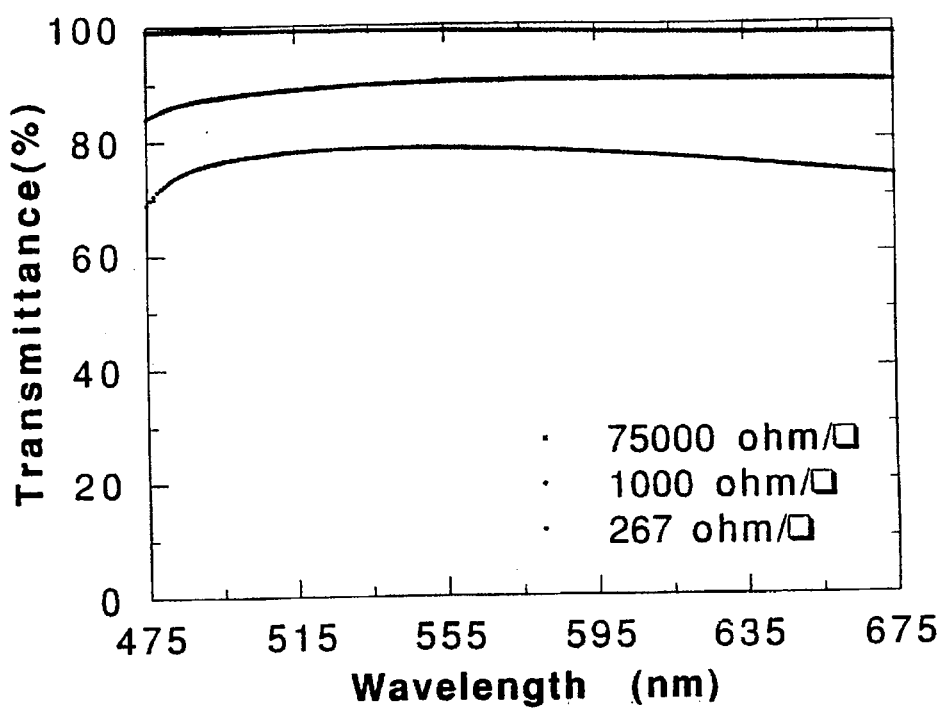
FIG. 9 is a series of visible transmittance spectrographs for PANi/CSA/PVAc films.

Example 5 was repeated, using polyvinylacetate (PVAc) as the host polymer The initial concentration of PVAc in m-cresol was 5% w/w. The bulk conductivity data are shown in FIG. 8. Spin cast films exhibit excellent visible light transmission; the spectra are shown in FIG. 9. This example demonstrates that conductive transparent films of the polyblends containing polyaniline complex at different concentrations in PVAc can be cast from solution.

Example 8

Figure 10:
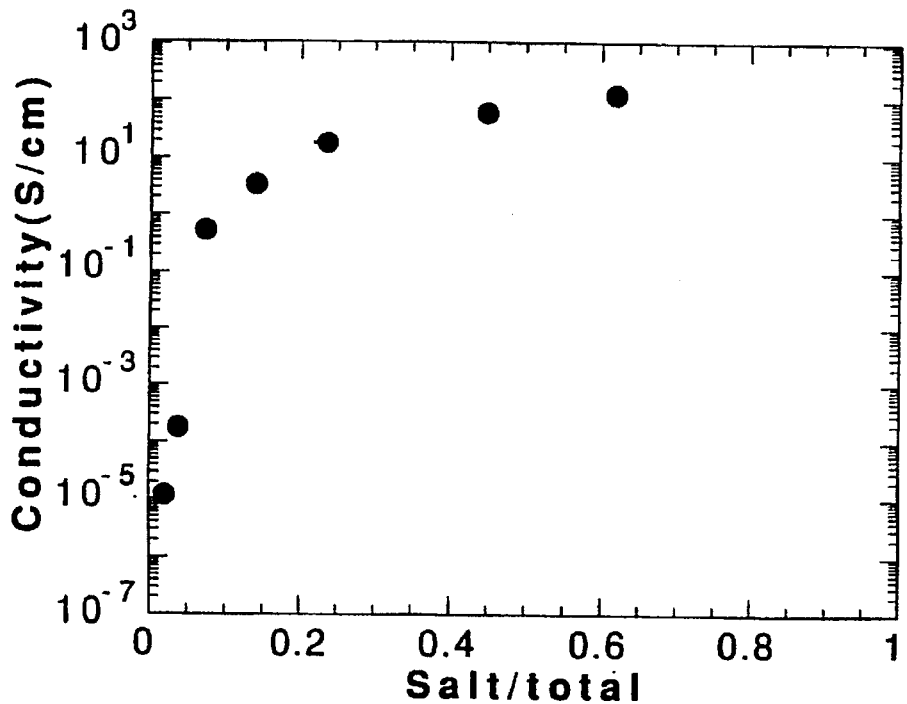
FIG. 10 is a graph of conductivity of PANi/CSA/PC films at various PANi concentrations.

Example 5 was repeated, using as polycarbonate (PC) as the host polymer. The initial concentration of PC in m-cresol was 4.74% w/w. The polyaniline-CSA complex content in the blend films was 62.0%, 44.9%, 23.6%, 14.0%, 7.3%, 3.8% and 2.0%, respectively. The electrical conductivity of resulting transparent free-standing blend films is shown in FIG. 10. This example demonstrates that conductive polyblend films of PANI-CSA with PC can be cast from solution.

Example 9

Figure 11:
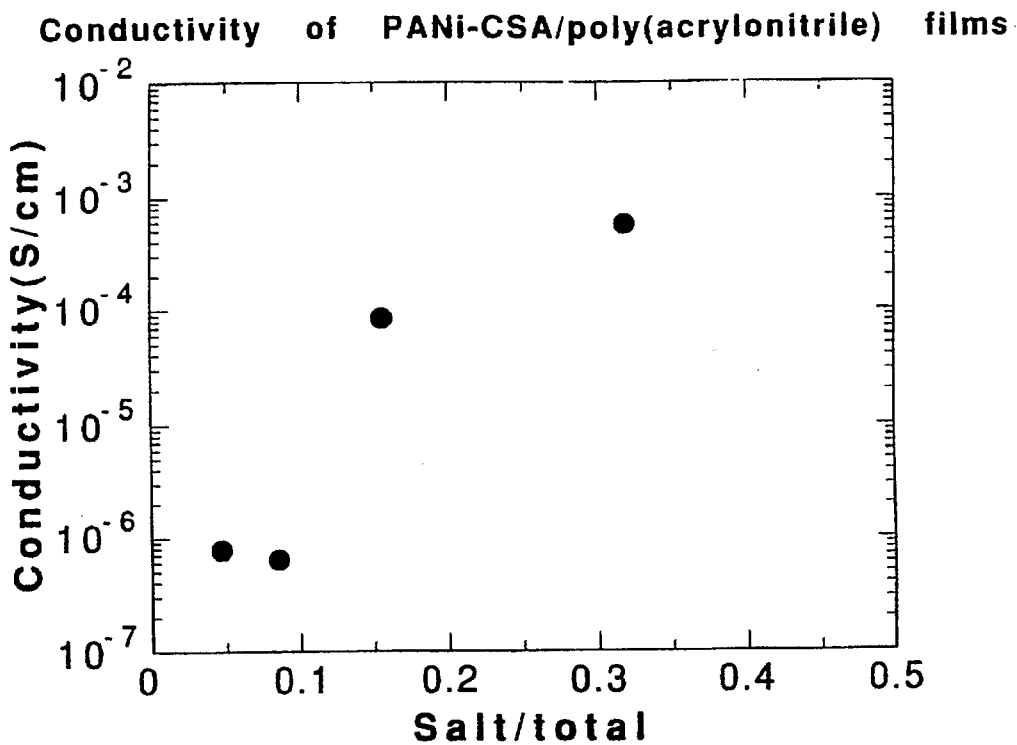
FIG. 11 is a graph of conductivity of PANi/CSA/poly (acrylonitrile) films at various PANi concentrations.

Example 4 was repeated, using poly(acrylonitrile), PAN as the host polymer. The PAN and polyaniline-CSA complex were dissolved in dimethylsulfoxide (DMSO) by stirring at room temperature to get solutions with concentrations 2%, 3.7%, respectively. The polyaniline-CSA complex content in resulting blend film was 31.9%, 15.6%, 8.6%, and 4.7%, respectively. The electrical conductivities of resulting free-standing blend films are shown in FIG. 11. The films exhibited excellent transparency in visible region, similar to those shown in FIG. 3 for PMMA blend. This example demonstrates that conductive polyblend films of PANI-CSA with PAN can be cast from solution.

Example 10

Figure 12:
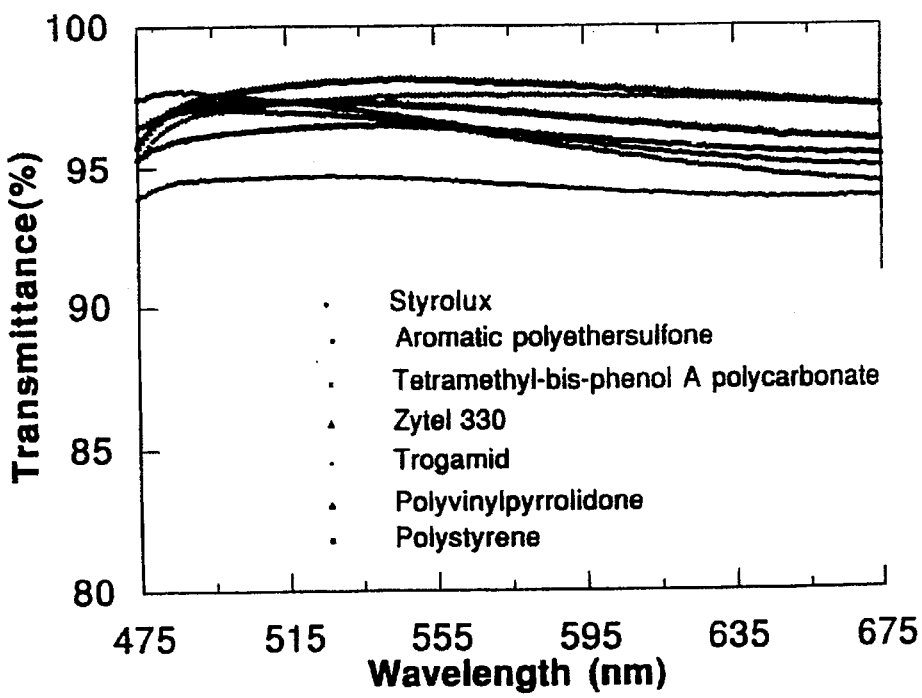
FIG. 12 is a series of visible transmittance spectrographs for various PANi/CSA/polymer films.

Example 4 was repeated, using Styrolux (a block co-polymer of polystyrene-butadiene; BASF), aromatic polyethersulfone, tetramethyl-bis-phenol A polycarbonate, Zytel 330 (amorphous Nylon; DuPont), Trogamid (amorphous Nylon; Hülls), polyvinylpyrrolidone (Polysciences), polystyrene (Polysciences), poly(styrene-acrilonitrile) (BASF) as host polymers. The polyaniline-CSA complex content in the resulting blend films were 8.8%, 4.6% and 0.96%. For all these polymers, optically transparent films were obtained. The bulk electrical conductivities of free-standing films are listed in Table 2. Spin cast film exhibit similar transmission spectra as shown in FIG. 12. This example demonstrates that conductive transparent films of the polyblends containing polyaniline complex at different concentrations in a wide variety of host polymers can be cast from solution.

TABLE 2

Conductivity of Blend Film of Polyaniline-CSA Complex with Several Commercial Polymers

| Polymer | Conductivity(S/cm) | | |
|---|---|---|---|
| | 8.8% | 4.6% | 0.96% |
| Styrolux | 6.4 | 2.2 | .02 |
| Aromatic polyether sulfone | 5.7 | 2.8 | .07 |
| tetramethyl-bis-phenyl A polycarbonate | 2.0 | .42 | .43 |
| Zytel 330 | 4.9 | .63 | .01 |

TABLE 2-continued

Conductivity of Blend Film of Polyaniline-CSA Complex with Several Commercial Polymers

| Polymer | Conductivity(S/cm) | | |
|---|---|---|---|
| | 8.8% | 4.6% | 0.96% |
| Trogamid | 4.6 | .73 | .003 |
| polyvinylpyrrolidone | 1.4 | 1.0 | .02 |
| polystyrene | 6.0 | 2.0 | .12 |
| poly(styrene-acrylonitrile) | 6.4 | 2.4 | .14 |

We claim:

1. A processible, essentially solvent-free liquid conductive polymeric composition for forming transparent conductors comprising a liquid substrate selected from the group consisting of molten matter solvent, molten or liquid bulk polymer and mixtures thereof each having a dielectric constant smaller than about 22 having intimately admixed therewith polyaniline of film-forming molecular weight in admixture with an effective protonating amount of a protonic acid, the counterion of said protonic acid being functionalized so as to be compatible with the substrate and forming a complex with the polyaniline and imparting conductivity to the composition said composition being solidifiable into a transparent conductor having a conductivity greater than about $10^{-8}$ S-cm$^{-1}$, a surface resistance of less than $10^6$ ohms/square and an integrated transmittance of more than 60% over the spectral range of 485 to 675 nm.

2. The composition of claim 1 wherein the substrate comprises liquid bulk polymer.

3. The composition of claim 1 wherein the substrate comprises molten or liquid bulk polymer.

4. The composition of claim 1 composed of from 0.1 to 99% by weight of polyaniline plus counterion.

5. A composition according to claim 3 wherein the liquid substrates dielectric constant is smaller than about 15.

6. The composition according to claim 3 wherein the molten polymer forms a transparent material.

* * * * *